(12) United States Patent
Chen et al.

(10) Patent No.: US 9,035,286 B2
(45) Date of Patent: May 19, 2015

(54) MULTI-COLOR LIGHT EMITTING DIODE AND METHOD FOR MAKING SAME

(71) Applicants: Kuei-Bai Chen, Hsinchu (TW); Chia-Hao Li, Hsinchu (TW); Chen-Hsien Liao, Hsinchu (TW)

(72) Inventors: Kuei-Bai Chen, Hsinchu (TW); Chia-Hao Li, Hsinchu (TW); Chen-Hsien Liao, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 13/770,404

(22) Filed: Feb. 19, 2013

(65) Prior Publication Data

US 2014/0231753 A1    Aug. 21, 2014

(51) Int. Cl.
H01L 35/24 (2006.01)
H01L 27/32 (2006.01)
H01L 51/00 (2006.01)

(52) U.S. Cl.
CPC ........... *H01L 27/322* (2013.01); *H01L 51/0002* (2013.01); *H01L 27/3246* (2013.01)

(58) Field of Classification Search
USPC ................. 257/40, 89, 642, E33.06, E33.061, 257/E51.012, E51.022, E51.046; 438/35, 438/69
See application file for complete search history.

(56) References Cited

U.S. PATENT DOCUMENTS

| | | |
|---|---|---|
| 2006/0152150 A1 | 7/2006 | Boerner et al. |
| 2008/0036367 A1 | 2/2008 | Eida et al. |
| 2008/0129195 A1* | 6/2008 | Ishizaki et al. ................ 313/504 |
| 2009/0091241 A1* | 4/2009 | Tsou et al. ..................... 313/504 |
| 2010/0134729 A1* | 6/2010 | Shibatani et al. ............. 349/106 |
| 2012/0038267 A1* | 2/2012 | Hanamura et al. ............ 313/504 |

FOREIGN PATENT DOCUMENTS

| | | |
|---|---|---|
| CN | 1685770 | 10/2005 |
| JP | 2002318543 | 10/2002 |
| JP | 2005123089 | 5/2005 |
| JP | 2006054200 | 2/2006 |
| JP | 2007103099 | 4/2007 |
| JP | 2007257907 | 10/2007 |
| JP | 2007273440 | 10/2007 |
| JP | 2008103256 | 5/2008 |
| JP | 2009087908 | 4/2009 |

(Continued)

OTHER PUBLICATIONS

Written Opinion and International Search Report issued on Jan. 23, 2014, in PCT/CN2013/086108, a counterpart international application (10 pages).

(Continued)

*Primary Examiner* — Su C Kim

(57) ABSTRACT

A color light-emitting diode using a blue light component to produce red light and green light is disclosed. A blue-light emitting material is provided between a cathode layer and an anode layer for emitting the blue light component. A light re-emitting layer has a first material in a first diode section arranged to produce a red light component in response to the blue light component, and a second material in a second diode section arranged to produce a green light component in response to the blue light component. A transparent material in a third diode section allows part of the blue light component to transmit through. The anode layer is partitioned into three electrode portions separately located in the three diode sections, so that the red, green and blue light components in the diode sections can be separately controlled.

20 Claims, 4 Drawing Sheets

(56) References Cited

FOREIGN PATENT DOCUMENTS

| | | |
|---|---|---|
| JP | 2009199884 | 9/2009 |
| WO | 2006022123 | 3/2006 |

OTHER PUBLICATIONS

JP Office Action issued on Sep. 2, 2014, in corresponding Japanese application 2013-254292 (2 pages).

* cited by examiner

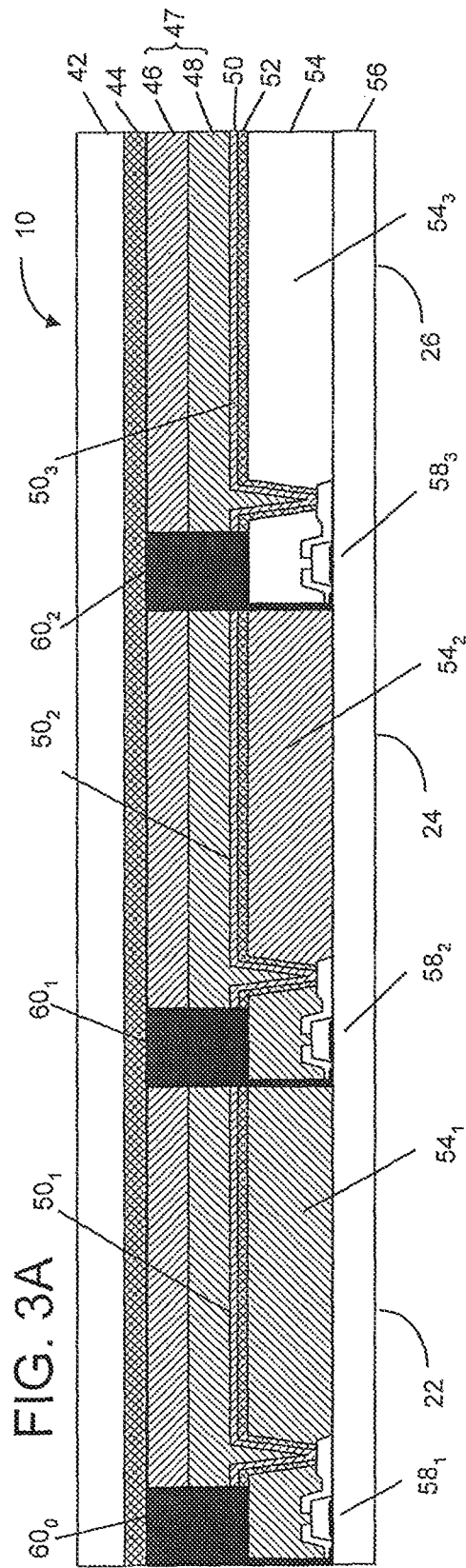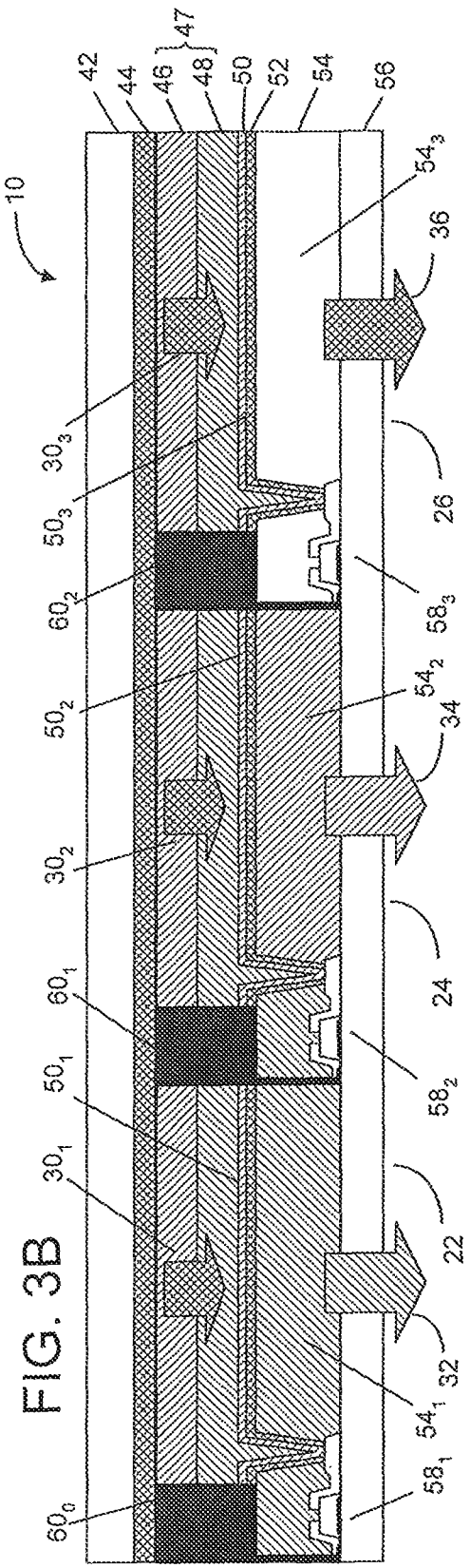

MULTI-COLOR LIGHT EMITTING DIODE AND METHOD FOR MAKING SAME

FIELD OF THE INVENTION

The present invention relates generally to a multi-color light-emitting diode and, more specifically, to a light-emitting diode that is capable of emitting light in red, green and blue colors.

BACKGROUND OF THE INVENTION

Light-Emitting Diodes (LEDs) and Organic Light-Emitting Diodes (OLEDs) have been used in making color display panels. As with an LCD display, an OLED display produces color images based on three primary colors in R, G and B. A color pixel in an OLED display can be made of an R sub-pixel, a G sub-pixel and a B sub-pixel. In general, the brightness of the OLED material is approximately proportional to current and, therefore, different colors and shades can be achieved by controlling the currents. The advantage of OLEDs over Liquid-Crystal Display (LCD) includes the fact that OLEDs are able to emit light whereas a pixel in an LCD acts as a light-valve mainly to transmit light provided by a backlight unit. Thus, an LED/OLED panel can, in general, be made thinner than an LCD panel. Furthermore, it is known that the liquid crystal molecules in an LCD panel have slower response time. An OLED display also offers higher viewing angles, a higher contrast ratio and higher electrical power efficiency than its LCD counterpart.

A typical color display panel has a plurality of pixels arranged in a two-dimensional array, driven by a data driver and a gate driver. As shown in FIG. 1, a plurality of pixels 10 in a display panel 1 are arranged in rows and columns in a display area 100. A data driver 200 is used to provide data signals to each of the columns and a gate driver 300 is used to provide a gate line signal to each of the rows. In a color display panel, an image is generally presented in three colors: red (R), green (G) and blue (B). Each of the pixels 10 is typically divided into three color sub-pixels: red sub-pixel, green sub-pixel and blue sub-pixel.

The present invention is concerned with a color pixel having RGB sub-pixels and a method for making same.

SUMMARY OF THE INVENTION

The present invention provides a color light-emitting diode using a blue light component to produce red light and green light. In one embodiment of the present invention, a blue-light emitting material is provided between a cathode layer and an anode layer for emitting the blue light component. A light re-emitting layer has a first material in a first diode section arranged to produce a red light component in response to the blue light component, and a second material in a second diode section arranged to produce a green light component in response to the blue light component. A transparent material in a third diode section allows part of the blue light component to transmit through. The anode layer is partitioned into three electrode portions separately located in the three diode sections, so that the red, green and blue light components in the diode sections can be separately controlled.

Thus, the first aspect of the present invention is a light emitting diode, comprising:
 a first electrode layer;
 a second electrode layer;
 an organic layer disposed between the first and second electrode layers arranged to emit a first light component in a first wavelength through the second electrode layer;
 a light re-emitting layer adjacent to the second electrode layer, arranged to receive at least part of the first light component, the light re-emitting layer comprising a first excitable material arranged to emit a second light component in a second wavelength longer than the first wavelength in response to the first light component, and a second excitable material arranged to emit a third light component in a third wavelength longer than the second wavelength in response to the first light component. The first wavelength is in a wavelength range of 450 nm to 480 nm, the second wavelength is in a wavelength range of 490 nm to 570 nm, and the third wavelength is in a wavelength range of 590 nm to 650 nm. Alternatively, the first wavelength is in a wavelength range of 460 nm to 520 nm, the second wavelength is in a wavelength range of 490 nm to 570 nm, and the third wavelength is in a wavelength range of 590 nm to 650 nm.

The light emitting diode further comprises:
 a passivation layer between the light re-emitting layer and the second electrode layer;
 a first barrier and a second barrier arranged to partition the light emitting diode into a first diode section, a second diode section and a third diode section, the first barrier arranged to separate the first excitable material from the second excitable material in the light re-emitting layer such that the first excitable material is located in a first diode portion and the second excitable material is located in the second diode section; the second barrier arranged to separate the first excitable material from the third diode section; the first and second barriers also arranged to partition the first electrode layer into a first electrode section in the first diode section, a second electrode section in the second diode section and a third electrode section in the third diode section; and
 a first switching element connected to the first electrode section, a second switching element connected to the second electrode section and a third switching element connected to the third electrode section.

In one embodiment of the present invention, the light re-emitting layer further comprises a third material to transmit at least part of the first light component. In another embodiment of the present invention, the third material is arranged to provide a fourth light component in a fourth wavelength longer than the first wavelength but shorter than the second wavelength. The third material can be a color filter or an excitable material arranged to emit the fourth light component in response to the first light component. The first wavelength is in a wavelength range of 380 nm to 480 nm; the second wavelength is in a wavelength range of 490 nm to 570 nm; the third wavelength is in a wavelength range of 590 nm to 650 nm, and the fourth wavelength is in a wavelength range of 410 nm to 480 nm.

The second aspect of the present invention is a display panel, comprising:
 a substrate;
 a plurality of pixels formed on the substrate, each pixel comprising a light-emitting diode, the light-emitting diode comprising:
 a first electrode layer;
 a second electrode layer;

an organic layer disposed between the first and second electrode layers arranged to emit a first light component in a first wavelength through the second electrode layer;

a light re-emitting layer adjacent to the second electrode layer, arranged to receive at least part of the first light component, the light re-emitting layer comprising a first excitable material arranged to emit a second light component in a second wavelength longer than the first wavelength in response to the first light component, and a second excitable material arranged to emit a third light component in a third wavelength longer than the second wavelength in response to the first light component.

The third aspect of the present invention is a method for producing a light emitting diode, comprising:

providing a first electrode layer and a second electrode layer on a substrate;

disposing an organic layer between the first and second electrode layers, the organic layer arranged to emit a first light component in a first wavelength through the second electrode layer;

disposing a light re-emitting layer adjacent to the second electrode layer, the light re-emitting layer arranged to receive at least part of the first light component, the light re-emitting layer comprising a first excitable material arranged to emit a second light component in a second wavelength longer than the first wavelength in response to the first light component, and a second excitable material arranged to emit a third light component in a third wavelength longer than the second wavelength in response to the first light component.

The method further comprises:

providing a first barrier and a second barrier arranged to partition the light emitting diode into a first diode section, a second diode section and a third diode section, the first barrier arranged to separate the first excitable material from the second excitable material in the light re-emitting layer such that the first excitable material is located in a first diode portion and the second excitable material is located in the second diode section; the second barrier arranged to separate the first excitable material from the third diode section; the first and second barriers also arranged to partition the first electrode layer into a first electrode section in the first diode section, a second electrode section in the second diode section and a third electrode section in the third diode section; and providing a first switching element connected to the first electrode section, a second switching element connected to the second electrode section and a third switching element connected to the third electrode section.

In one embodiment of the present invention, the method further comprises providing a color filter in the third diode section, the color filter configured to transmit at least part of the first light component.

BRIEF DESCRIPTION OF THE DRAWINGS

FIG. 3A shows a cross sectional view of the color pixel of FIG. 2.

FIG. 3B shows a graphical representation of the color pixel of FIG. 3A when the pixel emits light.

DETAILED DESCRIPTION OF THE INVENTION

Figure 2:
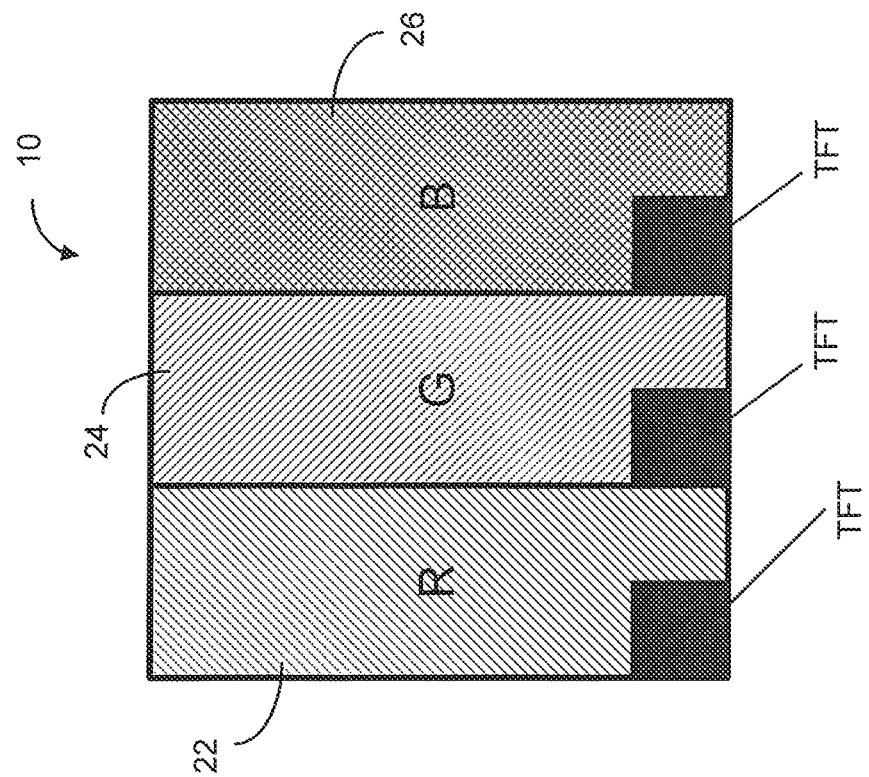
FIG. 2 shows a color pixel, according to one embodiment of the present invention.

In an OLED pixel, according to various embodiments of the present invention, the same luminescent layer is used as the light source for all three color sub-pixels. As shown in FIG. 2, the color pixel 10 comprises three color sub-pixels 22, 24 and 26 for producing light in three colors R, G and B. Each color sub-pixel has a switching element such as a thin-film transistor (TFT) to activate the color sub-pixel. As shown in FIG. 3A, the color pixel 10 comprises a first substrate or protective layer 42, a first electrode layer 44, an organic layer 47, a second electrode layer 50, a passivation layer 52, a light re-emitting layer 54 and a second substrate 56. In one embodiment of the present invention, the first electrode layer 44 comprises a cathode layer; the second electrode layer 50 comprises an anode layer including anode portions $50_1$, $50_2$ and $50_3$; and the organic layer 47 comprises a luminescent layer 46 and a hole injection layer 48. The luminescent layer 46 comprises a blue light-emitting material, for example. The light re-emitting layer 54 comprises a first layer portion $54_1$ having red-light emitting material, and a second layer portion $54_2$ having a green-light emitting material. The red-light emitting material is selected for emitting red light and the green-light emitting material is selected for emitting green light in response to the blue light emitted in luminescent layer 46. The third layer portion $54_3$ may comprise a material which is substantially transparent to blue light. The blue light is in a wavelength range of 450 nm to 480 nm; the green light is in a wavelength range of 490-570 nm and the red light is in a wavelength range of 590 nm to 650 nm, for example.

In another embodiment of the present invention, the luminescent layer 46 comprises a blue-greenish light-emitting material arranged to emit blue-greenish light in a wavelength range of 460-520 nm. The third layer portion $54_3$ may comprise a material which is substantially transparent to blue-greenish light in the wavelength range of 460-520 nm or may comprise a blue color filter arranged to transmit blue light in the wavelength range of 450 nm to 480 nm.

In a different embodiment of the present invention, the luminescent layer 46 comprises a violet light-emitting material, for example. The light re-emitting layer 54 comprises a first layer portion $54_1$ having red-light emitting material; a second layer portion $54_2$ having a green-light emitting material; and a third layer portion $54_3$ having a blue-light emitting material. The red-light emitting material is selected for emitting red light; the green-light emitting material is selected for emitting green light; and the blue-light emitting material is selected for emitting blue light in response to the violet light emitted in luminescent layer 46. The violet light is in a wavelength range of 380 nm to 450 nm; the blue light is in a wavelength range of 450 nm to 480 nm; the green light is in a wavelength range of 490-570 nm and the red light is in a wavelength range of 590 nm to 650 nm, for example. In yet another embodiment, the violet light is in a wavelength range of 380 nm to 480 nm and the third layer portion $54_3$ comprises a blue color filter arranged to transmit blue light in a wavelength range of 410 nm to 480 nm.

Figure 4:
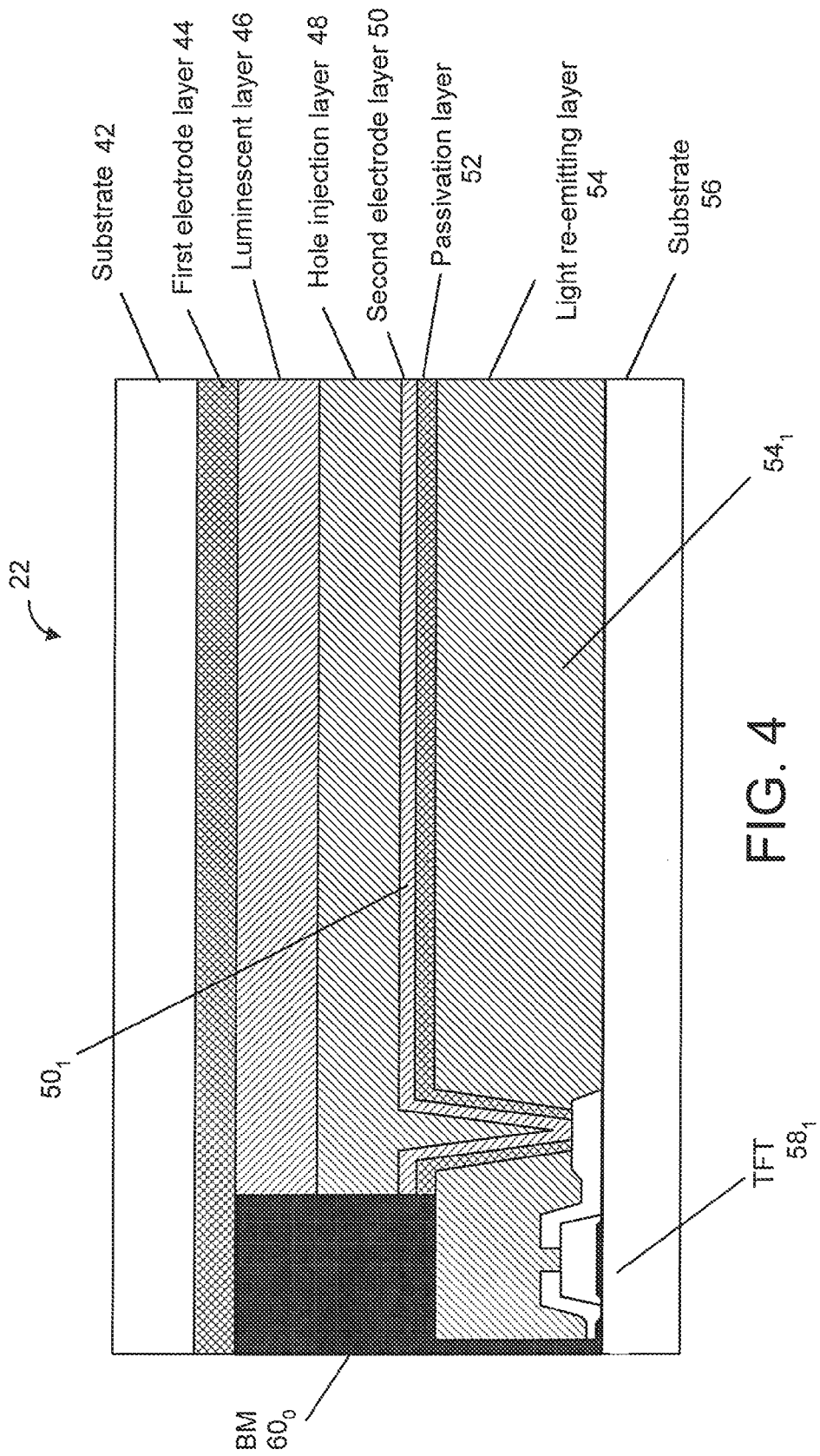
FIG. 4 shows a layered structure of a sub-pixel which is part of the color pixel of FIG. 3A.

In each color pixel 10, two or more insulating barriers (BM) 60 are used to partition pixel 10 into three color sub-pixels 22, 24, and 26. As shown in FIGS. 3A and 3B, first barrier $60_1$ is provided between color sub-pixels 22 and 24, and second barrier $60_2$ is provided between color sub-pixels 24 and 26. As shown in FIGS. 3A, 3B and 4, color sub-pixel 22 also has another barrier $60_0$. However, at least the first electrode layer 44 (used as a cathode) can be shared by the color sub-pixels 22, 24 and 26. According to one embodiment of the present invention, the color sub-pixels 22, 24 and 26 can have the same organic layers 47. In that case, the color sub-pixels 22, 24 and 26 can have the same luminescent layer 46 that comprises a blue-light emitting material. For example, the luminescent layer 46 may comprise organometallic complexes such as trivalent metal quinolate complexes, Schiff base divalent metal complexes, metal acetylacetonate complexes, metal bidentate ligand complexes, bisphosphonates, metal maleontriledithiolate complexes, molecular charge transfer complexes, aromatic and heterocyclic polymers and rare earth mixed chelates or the like. The color sub-pixels 22, 24 and 26 have three switching elements such as thin-film transistors (TFTs) $58_1$, $58_2$ and $58_3$ to control the color sub-pixels 22, 24 and 26. Each of the color sub-pixels 22, 24, 26 has its anode layer portions $50_1$, $50_2$, $50_3$ separately connected to a switching element so that the brightness of each color sub-pixel can be individually controlled. When a voltage is applied between the common cathode layer 44 and the anode layer portion $50_1$, $50_2$, $50_3$ in each of the color sub-pixels 22, 24, 26, blue light portions $30_1$, $30_2$, $30_3$ emitted in the organic layer 47 are transmitted toward the light re-emitting layer 54 as shown in FIG. 3B. It is understood that the amplitude or intensity of blue light portion $30_1$ may be different from that of blue light portion $30_2$, and blue light portion $30_3$ depending on the applied voltage in the color sub-pixels 22, 24 and 26. As shown in FIG. 4, the color sub-pixel 22 is used for producing red light. Thus, the first layer portion $54_1$ in the color sub-pixel 22 comprises a first excitable material arranged to produce light 32 in a longer wavelength range in response to the excitation of the blue light portion $30_1$ (FIG. 3B). The first excitable material in the first layer portion $54_1$ in the color sub-pixel 22 may comprise 1-ethyl-2-[4-(p-dimethylaminophenyl)-1,3-butadienyl]pyridinium perchlorate, or 4-(Dicyanomethylene)-2-tert-butyl-6-(1,1,7,7,-tetramethyljulolidyl-9-enyl)-4H-pyran. The longer wavelength range may cover a range of 590 nm to 650 nm. Similarly, the color sub-pixel 24 is used for producing green light. Thus, the second layer portion $54_2$ in the color sub-pixel 24 comprises a second excitable material arranged to produce light 34 in a different wavelength range in response to the excitation of the blue light portion $30_2$ (FIG. 3B). The second excitable material in the second layer portion $54_2$ in the color sub-pixel 24 may comprise Aluminum 8-hydroxyquinolinate, Aluminum oxinate or 3-(2'-benzothiazolyl)-7-diethylaminocoumarin. This different wavelength range may cover a range of 490 nm to 570 nm. The blue light 30 may cover a wavelength range of 450 nm to 480 nm, but this range can be extended to the violet region of 380 nm to 450 nm.

It should be noted that the layered structure as shown in FIG. 3A is only for illustrating the operating principle of the multi-color OLED, according to one embodiment of the present invention. It is understood that the pixel may comprise other layers such as hole transport layer (HTL), and electron transport layer (ETL). Furthermore, the multi-color pixel 10 can be constructed with the anode layer adjacent to the first substrate 42 and the cathode connected to TFT.

The anode layer 50 can be made of any one of the following metallic oxides or the combination thereof: indium-tin oxide, aluminum-doped zinc oxide, indium-doped zinc-oxide, tin-oxide, magnesium-tin oxide, nickel-tungsten oxide, cadmium-tin oxide and the like. The cathode layer can be made of any one of the following metals or the alloys thereof: aluminum, silver, magnesium-silver alloy and the like.

Figure 1:
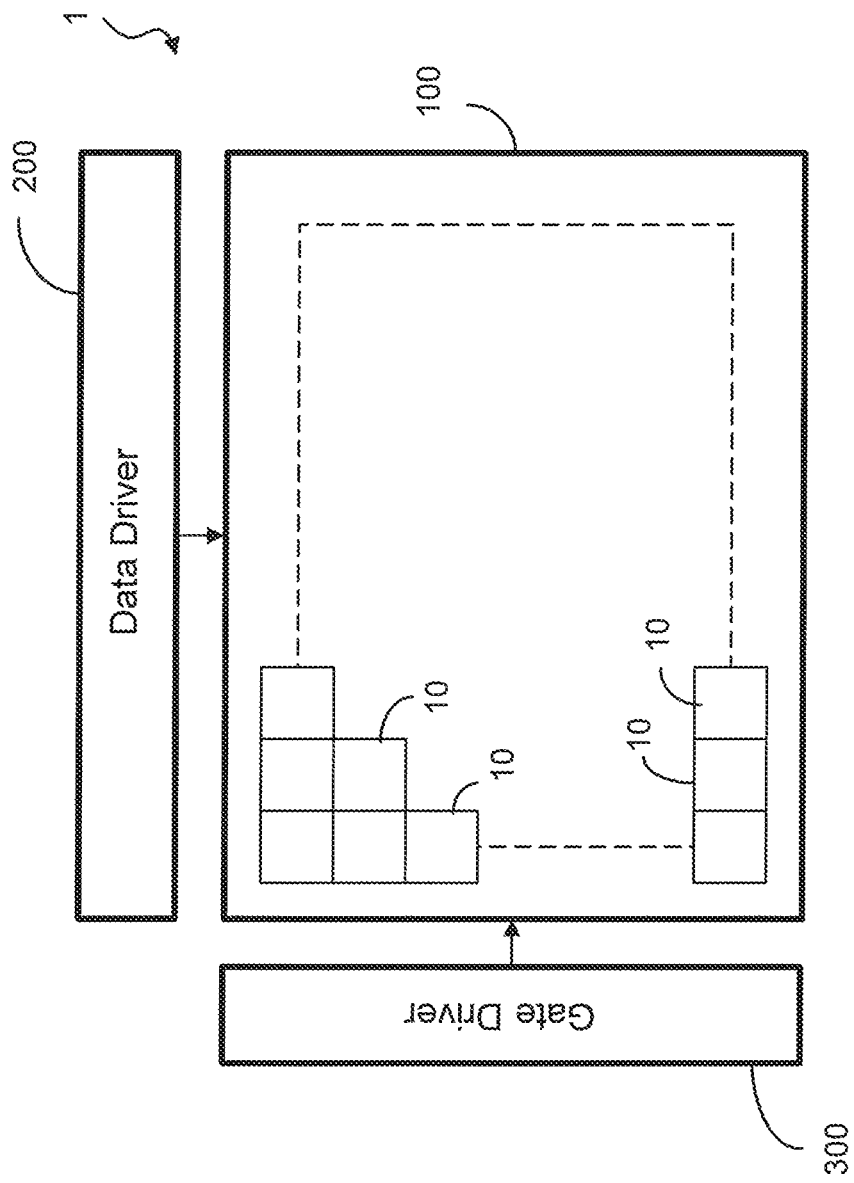
FIG. 1 shows a typical display panel having rows and columns of pixels in a display area.
Figure 5:
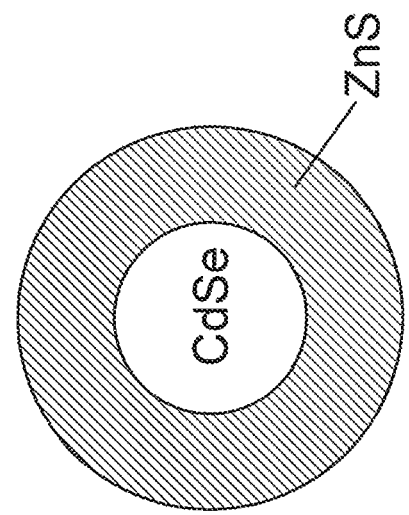
FIG. 5 is a graphical representation of a quantum dot used in the color sub-pixels, according to one embodiment of the present invention.

In a different embodiment of the present invention, quantum dots (see FIG. 5) may be used in the light re-emitting layer 54 to produce light in response to the excitation of blue light portions $30_1$, $30_2$, $30_3$. The size of the quantum dots in the first layer portion $54_1$ in the color sub-pixel 22 is chosen to produce light in the wavelength range of 590 nm to 650 nm. Likewise, the size of the quantum dots in the second layer portion $54_2$ in the color sub-pixel 24 is chosen to produce light in the wavelength range of 490 nm to 570 nm. In the embodiment where the third layer portion $54_3$ in the color sub-pixel 26 is used to produce blue light in response to violet light, the size of the quantum dots in the third layer portion $54_3$ is chosen to produce light in the wavelength range of 450 nm to 480 nm, for example.

In summary, according to various embodiments of the present invention, one luminescent layer is used to produce a shorter-wavelength light component. This shorter-wavelength light component is used to excite two or three excitable materials to produce two or three longer-wavelength light components. Thus, the light emitting diode according to the present invention may comprise: a first electrode layer; a second electrode layer; an organic layer disposed between the first and second electrode layers arranged to emit light in a first wavelength through the second electrode layer; a light re-emitting layer adjacent to the second electrode layer arranged to receive at least part of the light in the first wavelength, the light re-emitting layer comprising a first excitable material arranged to emit light in a second wavelength longer than the first wavelength in response to the light in the first wavelength; and a second excitable material arranged to emit light in a third wavelength longer than the second wavelength in response to the light in the first wavelength. The light in first wavelength is blue light in the wavelength range of 450 nm to 480 nm; the light in the second wavelength is green light in the wavelength range of 490 nm to 570 nm; and the light in the third wavelength is red light in the wavelength range of 590 nm to 650 nm. In another embodiment of the present invention, the light in the first wavelength is blue-greenish light in the wavelength of 460 nm to 520 nm.

In a different embodiment of the present invention, the light re-emitting layer further comprises a third excitable material arranged to emit light in a fourth wavelength longer than the first wavelength but shorter than the second wavelength. The light in first wavelength is violet light in the wavelength range of 380 nm to 450 nm; the light in the second wavelength is green light in the wavelength range of 490 nm to 570 nm; the light in the third wavelength is red light in the wavelength range of 590 nm to 650 nm; and the light in the fourth wavelength is blue light in the wavelength range of 410 nm to 480 nm or 450 nm to 480 nm.

The present invention has been described as an OLED arranged to produce light components in R, G, B from a light source in B, or to produce light components in R, G, B by excitation of a light source in violet. It is understood that the light components produced in an OLED may have two different colors such as R, G light components re-emitted upon being excited by a light source in B. Furthermore, FIGS. 2, 3A and 3B are for illustration purposes only. It is possible to rearrange the color sub-pixels 22, 24, 26 in a different order such as 22, 26, 24. Moreover, the three color sub-pixels 22, 24, 26 are not necessarily arranged in a single row.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A light emitting diode, comprising:
a first electrode layer;
a second electrode layer;
an organic layer disposed between the first and second electrode layers arranged to emit a first light component in a first wavelength through the second electrode layer;
a light re-emitting layer adjacent to the second electrode layer, arranged to receive at least part of the first light component, the light re-emitting layer comprising a first excitable material arranged to emit a second light component in a second wavelength longer than the first wavelength in response to the first light component, and a second excitable material arranged to emit a third light component in a third wavelength longer than the second wavelength in response to the first light component, wherein the light re-emitting layer further comprises a third excitable material arranged to provide a fourth light component in a fourth wavelength longer than the first wavelength but shorter than the second wavelength.

2. The light emitting diode according to claim 1, wherein the first wavelength is in a wavelength range of 450 nm to 480 nm, the second wavelength is in a wavelength range of 490 nm to 570 nm, and the third wavelength is in a wavelength range of 590 nm to 650 nm.

3. The light emitting diode according to claim 1, wherein the first wavelength is in a wavelength range of 460 nm to 520 nm, the second wavelength is in a wavelength range of 490 nm to 570 nm, and the third wavelength is in a wavelength range of 590 nm to 650 nm.

4. The light emitting diode according to claim 1, wherein the first wavelength is in a wavelength range of 380 nm to 480 nm; the second wavelength is in a wavelength range of 490 nm to 570 nm; the third wavelength is in a wavelength range of 590 nm to 650 nm, and the fourth wavelength is in a wavelength range of 410 nm to 480 nm.

5. The light emitting diode according to claim 1, further comprising:
a first barrier and a second barrier arranged to partition the light emitting diode into a first diode section, a second diode section and a third diode section, the first barrier arranged to separate the first excitable material from the second excitable material in the light re-emitting layer such that the first excitable material is located in a first diode portion and the second excitable material is located in the second diode section; the second barrier arranged to separate the first excitable material from the third diode section; the first and second barriers also arranged to partition the second electrode layer into a first electrode section in the first diode section, a second electrode section in the second diode section and a third electrode section in the third diode section; and
a first switching element connected to the first electrode section, a second switching element connected to the second electrode section and a third switching element connected to the third electrode section.

6. A display panel, comprising:
a substrate;
a plurality of pixels formed on the substrate, each pixel comprising a light-emitting diode, the light-emitting diode comprising:
a first electrode layer;
a second electrode layer;
an organic layer disposed between the first and second electrode layers arranged to emit a first light component in a first wavelength through the second electrode layer;
a light re-emitting layer adjacent to the second electrode layer, arranged to receive at least part of the first light component, the light re-emitting layer comprising a first excitable material arranged to emit a second light component in a second wavelength longer than the first wavelength in response to the first light component, and a second excitable material arranged to emit a third light component in a third wavelength longer than the second wavelength in response to the first light component;
a first barrier and a second barrier arranged to partition the light emitting diode into a first diode section, a second diode section and a third diode section, the first barrier arranged to separate the first excitable material from the second excitable material in the light re-emitting layer such that the first excitable material is located in a first diode portion and the second excitable material is located in the second diode section; the second barrier arranged to separate the first excitable material from the third diode section; the first and second barriers also arranged to partition the second electrode layer into a first electrode section in the first diode section, a second electrode section in the second diode section and a third electrode section in the third diode section; and
a first switching element connected to the first electrode section, a second switching element connected to the second electrode section and a third switching element connected to the third electrode section.

7. The display panel according to claim 6, further comprising a color filter located in the third diode section, the color filter arranged to transmit at least part of the first light component.

8. A method for producing a light emitting diode, comprising:
providing a first electrode layer and a second electrode layer on a substrate;
disposing an organic layer between the first and second electrode layers, the organic layer arranged to emit a first light component in a first wavelength through the second electrode layer;
disposing a light re-emitting layer adjacent to the second electrode layer, the light re emitting layer arranged to receive at least part of the first light component, the light re-emitting layer comprising a first excitable material arranged to emit a second light component in a second wavelength longer than the first wavelength in response to the first light component, and a second excitable material arranged to emit a third light component in a third wavelength longer than the second wavelength in response to the first light component;
providing a first barrier and a second barrier arranged to partition the light emitting diode into a first diode section, a second diode section and a third diode section, the first barrier arranged to separate the first excitable material from the second excitable material in the light re-emitting layer such that the first excitable material is located in a first diode portion and the second excitable material is located in the second diode section; the second barrier arranged to separate the first excitable material from the third diode section; the first and second barriers also arranged to partition the second electrode layer into a first electrode section in the first diode section, a second electrode section in the second diode section and a third electrode section in the third diode section; and
providing a first switching element connected to the first electrode section, a second switching element connected to the second electrode section and a third switching element connected to the third electrode section.

9. The method according to claim 8, further comprising providing a color filter in the third diode section, the color filter configured to transmit at least part of the first light component.

10. A display panel comprising a plurality of pixels, wherein each of the pixels comprises a light emitting diode according to claim 1.

11. The display panel according to claim 6, wherein the first wavelength is in a wavelength range of 450 nm to 480 nm, the second wavelength is in a wavelength range of 490 nm to 570 nm, and the third wavelength is in a wavelength range of 590 nm to 650 nm.

12. The display panel according to claim 6, wherein the first wavelength is in a wavelength range of 460 nm to 520 nm, the second wavelength is in a wavelength range of 490 nm to 570 nm, and the third wavelength is in a wavelength range of 590 nm to 650 nm.

13. The display panel according to claim 6, wherein the light re-emitting layer further comprises a third material arranged to provide a fourth light component in a fourth wavelength longer than the first wavelength but shorter than the second wavelength.

14. The display panel according to claim 13, wherein the first wavelength is in a wavelength range of 380 nm to 480 nm; the second wavelength is in a wavelength range of 490 nm to 570 nm; the third wavelength is in a wavelength range of 590 nm to 650 nm, and the fourth wavelength is in a wavelength range of 410 nm to 480 nm.

15. The display panel according to claim 13, wherein the third material comprises a color filter.

16. The display panel according to claim 13, wherein the third material is an excitable material.

17. The display panel according to claim 6, wherein the first excitable material comprises 1-ethyl-2-[4-(p-dimethylaminophenyl)-1,3-butadienyl]pyridinium perchlorate, or 4-(Dicyanomethylene)-2-tert-butyl-6-(1,1,7,7,-tetramethyl-julolidyl-9-enyl)-4-H-pyran.

18. The display panel according to claim 6, wherein the second excitable material comprises Aluminum 8-hydroxyquinolinate, Aluminum oxinate or 3-(2'-benzothiazolyl)-7-diethylaminocoumarin.

19. The display panel according to claim 6, wherein the first excitable material comprises one or more quantum dots of a first size chosen to produce light in a wavelength range of 590 nm to 650 nm, and the second excitable material comprises one or more quantum dots of a second size chosen to produce light in a wavelength range of 490 nm to 570 nm.

20. The light-emitting diode according to claim 1, wherein the first excitable material comprises one or more quantum dots of a first size chosen to produce light in a wavelength range of 590 nm to 650 nm; the second excitable material comprises one or more quantum dots of a second size chosen to produce light in a wavelength range of 490 nm to 570 nm; and the third excitable material comprises one or more quantum dots of a third size chosen to produce light in a wavelength range of 450 nm to 480 nm.

* * * * *